(12) United States Patent
Han et al.

(10) Patent No.: US 11,335,893 B2
(45) Date of Patent: May 17, 2022

(54) MANUFACTURING METHOD OF OLED MICROCAVITY STRUCTURE

(71) Applicant: BOE TECHNOLOGY GROUP CO., LTD., Beijing (CN)

(72) Inventors: Ying Han, Beijing (CN); Wei Liu, Beijing (CN); Jianye Zhang, Beijing (CN); Fengjuan Liu, Beijing (CN); Xing Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/955,195

(22) PCT Filed: Dec. 19, 2019

(86) PCT No.: PCT/CN2019/126615
§ 371 (c)(1),
(2) Date: Jun. 18, 2020

(87) PCT Pub. No.: WO2020/143422
PCT Pub. Date: Jul. 16, 2020

(65) Prior Publication Data
US 2021/0226180 A1 Jul. 22, 2021

(30) Foreign Application Priority Data
Jan. 11, 2019 (CN) .......................... 201910026331.5

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3211* (2013.01); *H01L 51/0023* (2013.01); *H01L 51/5218* (2013.01); *H01L 51/5265* (2013.01)

(58) Field of Classification Search
CPC . H01L 51/56; H01L 51/0023; H01L 51/5218; H01L 51/5265; H01L 51/5212; H01L 27/3211
See application file for complete search history.

(56) References Cited

U.S. PATENT DOCUMENTS 7,816,857 B2 10/2010 Ryu et al.
2007/0000538 A1* 1/2007 Shima ............... H01L 31/03685
136/258
(Continued)

FOREIGN PATENT DOCUMENTS

CN 1543284 A 11/2004
CN 101661997 A 3/2010
(Continued)

OTHER PUBLICATIONS

First Office Action dated Mar. 3, 2020 for application No. CN201910026331.5 with English translation attached.
(Continued)

*Primary Examiner* — Kyoung Lee
*Assistant Examiner* — Christina A Sylvia
(74) *Attorney, Agent, or Firm* — Nath, Goldberg & Meyer; Joshua B. Goldberg

(57) ABSTRACT

A manufacturing method of OLED microcavity structure is provided. The manufacturing method includes: forming a reflective anode on a substrate; forming a transparent conductive film layer having a thickness corresponding to a required pixel on the reflective anode; patterning the transparent conductive film layer and the reflective anode with a pixel mask corresponding to the required pixel to form a pattern of the required pixel; and repeating the above steps on a resultant structure surface according to display requirements until a pixel display structure required by a display device is obtained.

20 Claims, 17 Drawing Sheets

(51) Int. Cl.
*H01L 51/00* (2006.01)
*H01L 51/52* (2006.01)

(56) References Cited

U.S. PATENT DOCUMENTS

| | | | | |
|---|---|---|---|---|
| 2012/0018709 A1* | 1/2012 | Terao | ............. | H01L 51/5048 |
| | | | | 257/40 |
| 2013/0140533 A1* | 6/2013 | Lee | ............. | H01L 27/3218 |
| | | | | 257/40 |
| 2014/0191202 A1* | 7/2014 | Shim | ............. | H01L 27/3211 |
| | | | | 257/40 |
| 2017/0187001 A1* | 6/2017 | Fang | ............. | H01L 27/3211 |

FOREIGN PATENT DOCUMENTS

| | | |
|---|---|---|
| CN | 104904030 A | 9/2015 |
| CN | 109742266 A | 5/2019 |

OTHER PUBLICATIONS

Second Office Action dated Aug. 4, 2020 for application No. CN201910026331.5 with English translation attached.
Decision of Rejection dated Nov. 3, 2020 for application No. CN201910026331.5 with English translation attached.

\* cited by examiner

MANUFACTURING METHOD OF OLED MICROCAVITY STRUCTURE

CROSS-REFERENCE TO RELATED APPLICATION

This is a National Phase Application filed under 35 U.S.C. 371 as a national stage of PCT/CN2019/126615, filed Dec. 19, 2019, an application claiming the benefit of Chinese Application No. 201910026331.5, filed Jan. 11, 2019, the content of each of which is hereby incorporated by reference in its entirety.

TECHNICAL FIELD

The present disclosure relates to the technical field of OLED display with a wide color gamut, and in particular to a manufacturing method of OLED microcavity structure.

BACKGROUND

With the development of display technology, more and more attention has been paid to the richness of display colors of a display device, and it is expected that the display device can display more colorful colors and reproduce original colors of Nature so as to achieve more real and natural viewing effects, and therefore, technical solutions of wide color gamut display have become more important. In order to realize wide color gamut display, many display devices adopt a way of combining microcavity structures with color filters and controlling lengths of resonant cavities to realize wide color gamut display of RGB.

SUMMARY

The present disclosure discloses a manufacturing method of OLED microcavity structure, including:
forming a reflective anode on a substrate;
forming a transparent conductive film layer having a thickness corresponding to a required pixel on the reflective anode;
patterning the transparent conductive film layer and the reflective anode with a pixel mask corresponding to the required pixel to form a pattern of the required pixel; and
repeating the above steps on an obtained structure surface according to display requirements until a pixel display structure required by a display device is obtained.

The above manufacturing method provides a new manufacturing process of OLED microcavity structure, in which the reflective anode, patterning of which is very different from that of the transparent conductive film layer, is selected as a protection to prepare a relative thick transparent conductive film layer at one time, which eliminates an influence of an interface between separately prepared transparent conductive film layers on the outgoing light of the microcavity structure, and also overcomes the technical problem that reflectivity is affected because the reflective anode is etched for a plurality of times during a patterning process of the transparent conductive film layer.

Optionally, the pixel includes B pixels, G pixels, and R pixels, and the manufacturing method includes:
forming a first reflective anode on the substrate, forming a first transparent conductive film layer on the first reflective anode, and patterning the first transparent conductive film layer and the first reflective anode with a pixel mask corresponding to a B pixel to form a first structure surface;
forming a second reflective anode on the first structure surface, forming a second transparent conductive film layer on the second reflective anode, and patterning the second transparent conductive film layer and the second reflective anode with a pixel mask corresponding to a G pixel to form a second structure surface; and
forming a third reflective anode on the second structure surface, forming a third transparent conductive film layer on the third reflective anode, and patterning the third transparent conductive film layer and the third reflective anode with a pixel mask corresponding to a R pixel to form a third structure surface.

Optionally, the first transparent conductive film layer is subjected to an annealing process after the first structure surface is formed; and
the second transparent conductive film layer is subjected to an annealing process after the second structure surface is formed.

Optionally, the two annealing processes are both performed at 230° C. for 60 minutes.

Optionally, a thickness of the first transparent conductive film layer is 120 Å;
a thickness of the second transparent conductive film layer is 520 Å; and
a thickness of the third transparent conductive film layer is 820 Å.

Optionally, the step of patterning the transparent conductive film layer and the reflective anode with the pixel mask corresponding to the required pixel to form the pattern of the required pixel includes:
coating photoresist on the transparent conductive film layer;
covering the photoresist with the pixel mask corresponding to the required pixel, and then performing an exposure process and a development process on the photoresist; and
stripping off the photoresist with an acid solution and etching away part of the transparent conductive film layer and part of the reflective anode, which are not covered by the pixel mask.

Optionally, the step of stripping off the photoresist with the acid solution and etching away part of the transparent conductive film layer and part of the reflective anode, which are not covered by the pixel mask includes:
etching away part of the transparent conductive film layer, which is not covered by the pixel mask, with an acid solution; and
etching away part of the reflective anode, which is not covered by the pixel mask, with an acid solution.

Optionally, the reflective anode and the transparent conductive film layer are deposited by means of magnetron sputtering.

Optionally, a material of the reflective anode is molybdenum aluminum rubidium alloy.

BRIEF DESCRIPTION OF THE DRAWINGS

FIGS. 4A to 10 are schematic diagrams illustrating structural changes of a display device in a manufacturing process of OLED microcavity structure for R, G and B pixels according to an embodiment of the present disclosure.

FIG. 4A is a schematic diagram illustrating a process of depositing a first reflective anode on a substrate by magnetron sputtering.

FIG. 5 is a schematic diagram illustrating a structure of a substrate with the first reflective anode and the first transparent conductive film layer deposited thereon.

FIG. 6 is a schematic diagram illustrating a first structure surface after patterning the first transparent conductive film layer and the first reflective anode with a pixel mask corresponding to the blue pixel.

FIG. 7 is a schematic diagram illustrating a structure of the first structure surface with the second reflective anode and the second transparent conductive film layer deposited thereon.

FIG. 8 is a schematic diagram illustrating a second structure surface after patterning the second transparent conductive film layer and the second reflective anode with a pixel mask corresponding to the blue pixel.

FIG. 9 is a schematic diagram illustrating a structure of the second structure surface with the third reflective anode and the third transparent conductive film layer deposited thereon.

FIG. 10 is a schematic diagram illustrating a third structure surface after patterning the third transparent conductive film layer and the third reflective anode with a pixel mask corresponding to the red pixel.

DETAILED DESCRIPTION

The technical solutions of the embodiments of the present disclosure will be described clearly and completely below with reference to the drawings of the embodiments of the present disclosure. It is apparent that the embodiments described herein are merely some of the embodiments of the present disclosure, but not all of the embodiments. All other embodiments, which are obtained by those skilled in the art based on the embodiments of the present disclosure without inventive work, are within the protection scope of the present disclosure.

At present, a technical structure of white organic light-emitting diode (WOLED)+color filter (CF) is usually adopted in the manufacture of large-size organic light-emitting diodes (OLEDs). Such structure has the advantages of high utilization of organic electro-luminescence (EL) materials, low requirements of masks for evaporation of EL, and increased aperture ratio of top-emission EL.

Nowadays, the display devices need to meet higher and higher requirements of color gamut coverage, and the color gamut coverage may be improved by a combination of microcavity structures and color filters. For example, transparent conductive film layers having different thicknesses are used for R, G, B pixel anodes to realize different cavity lengths in a manufacturing process, which includes:

step 1, preparing R, G, B reflective anodes after preparing thin film transistors (TFTs);

step 2, preparing and patterning a transparent conductive film layer, which is named a first transparent conductive film layer and is corresponding to R pixels;

step 3, preparing and patterning a transparent conductive film layer, which is named a second transparent conductive film layer and is corresponding to R and G pixels, on the first transparent conductive film layer; and step 4, preparing and patterning a transparent conductive film layer, which is named a third transparent conductive film layer and is corresponding to R, G and B pixels, on the second transparent conductive film layer.

Three transparent conductive film layers having different thicknesses are obtained at last, with the first transparent conductive film layer for B pixels, the second transparent conductive film layer for G pixels, and the third transparent conductive film layer for R pixels. However, the interface between the transparent conductive film layers in the structure such manufactured may affect efficiency and spectrum of the outgoing light.

Figure 1:
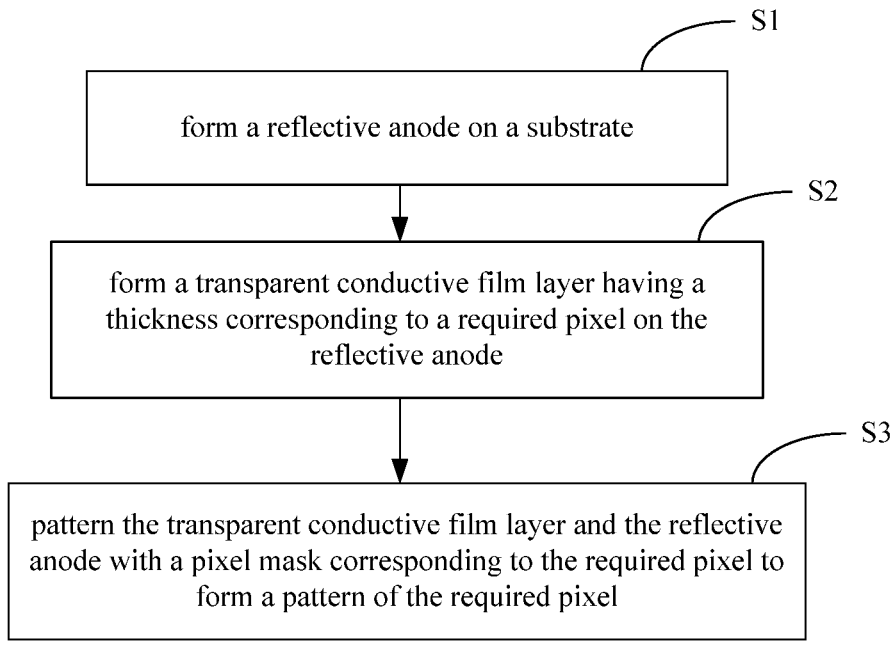
FIG. 1 is a flowchart illustrating a process of forming a pixel structure in a manufacturing method of OLED microcavity structure according to an embodiment of the present disclosure.

As shown in FIG. 1, an embodiment of the present disclosure provides a manufacturing method of an OLED microcavity structure, including:

step S1: forming a reflective anode on a substrate;

The substrate may refer to a thin film transistor 1, and a whole layer of reflective anode is formed on the resultant thin film transistor 1. Specifically, the reflective anode is deposited on the substrate by means of magnetron sputtering.

Step S2: forming a transparent conductive film layer having a thickness corresponding to a required pixel on the reflective anode;

In the manufacturing process, the thicknesses of the transparent conductive film layers are different for forming different pixels. Correspondingly, the transparent conductive film layers are also deposited on the reflective anodes by means of magnetron sputtering.

Step S3: patterning the transparent conductive film layer and the reflective anode with a pixel mask corresponding to the required pixel to form a pattern of the required pixel;

Each kind of pixel corresponds to one pixel mask according to display requirements; and in the manufacturing process, a pixel mask corresponding to a certain kind of pixel is selected when manufacturing such pixels, and the transparent conductive film layer and the reflective anode are patterned with the pixel mask, so as to form the pattern of the required pixel.

As shown in FIG. 1, one manufacturing process is completed by performing the above steps S1 to S3, and can form one kind of pixel structure. In production and manufacture processes, if a plurality of kinds of pixel structures are to be formed, the above steps are repeated on the obtained structure surfaces according to the display requirements until a pixel display structure required by a display device is obtained.

If a plurality of kinds of pixel structures are to be formed, it should be noted that the structure obtained by a previous manufacturing process is used as a substrate in a process of preparing a new pixel structure, that is, forming a reflective anode on the structure obtained by the previous manufacturing process, and then a next step is performed.

Specifically, a material of the reflective anode is preferably molybdenum aluminum rubidium alloy (MoAlNd), and a material of the transparent conductive film layer may be tin-doped indium oxide (ITO), or may be indium-doped zinc oxide (IZO), aluminum-doped zinc oxide (AZO), or fluorine-doped tin oxide (FTO). Moreover, the reflective anode is required to have certain etch selectivity with respect to the transparent conductive film layer, for example, ITO is selected as the material of the transparent conductive film layer if MoAlNd is selected as the material of the reflective anode, so that there is certain etch selectivity between the transparent conductive film layer and the reflective anode, and MoAlNd of the reflective anode will not be damaged when ITO is etched.

It can be seen that the embodiment of the present disclosure provides a new manufacturing process of an OLED microcavity structure, in which the reflective anode whose pattern is very different from that of the transparent conductive film layer is selected as a protection to prepare a relative thick transparent conductive film layer at one time, which eliminates an influence of the interface between separately prepared transparent conductive film layers on the outgoing light of the microcavity structure, and also overcomes the technical problem that reflectivity is affected because the reflective anode is etched for a plurality of times during a patterning process of the transparent conductive film layer.

Figure 2:
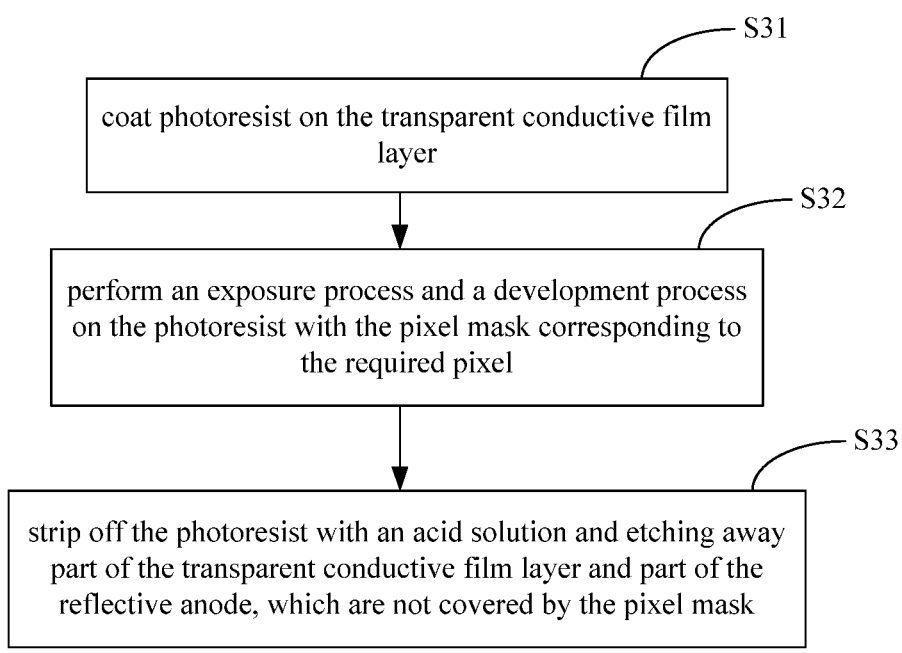
FIG. 2 is a flowchart illustrating a process of patterning a transparent conductive film layer and a reflective anode in a manufacturing method of OLED microcavity structure according to an embodiment of the present disclosure.

As shown in FIG. 2, the step of patterning the transparent conductive film layer and the reflective anode with the pixel mask corresponding to the required pixel to form the pattern of the required pixel includes:

step S31: coating photoresist on the transparent conductive film layer;

step S32: covering the photoresist with the pixel mask corresponding to the required pixel, and then performing an exposure process and a development process; and step S33: stripping off the photoresist with an acid solution and etching away part of the transparent conductive film layer and part of the reflective anode, which are not covered by the pixel mask.

Different kinds of photoresists and acid solutions are selected according to pixel manufacturing requirements and process requirements.

Figure 3:
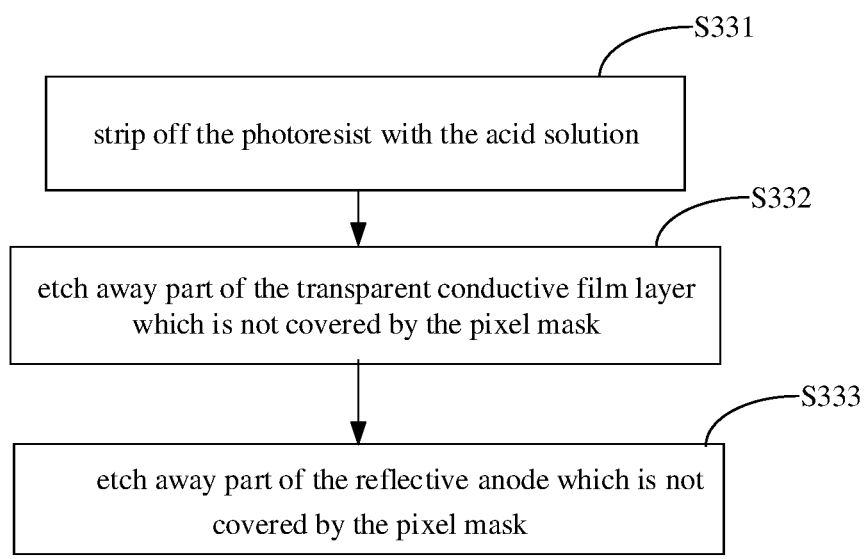
FIG. 3 is a flowchart illustrating a process of stripping off photoresist and etching a transparent conductive film layer and a reflective anode with an acid solution in a manufacturing method of OLED microcavity structure according to an embodiment of the present disclosure.

Specifically, with the transparent conductive film layer and the reflective anode being stacked, as shown in FIG. 3, the step of stripping off the photoresist with the acid solution and etching the transparent conductive film layer and the reflective anode includes:

step S331: stripping off the photoresist with the acid solution;

Step S332: etching away part of the transparent conductive film layer which is not covered by the pixel mask; and step S333: etching away part of the reflective anode which is not covered by the pixel mask.

It can be seen that the patterning of a certain kind of pixel structure in one manufacturing process involves one time of photoresist exposure and development and two times of etching, so as to finally form a pattern of the pixel structure.

Figure 3A:
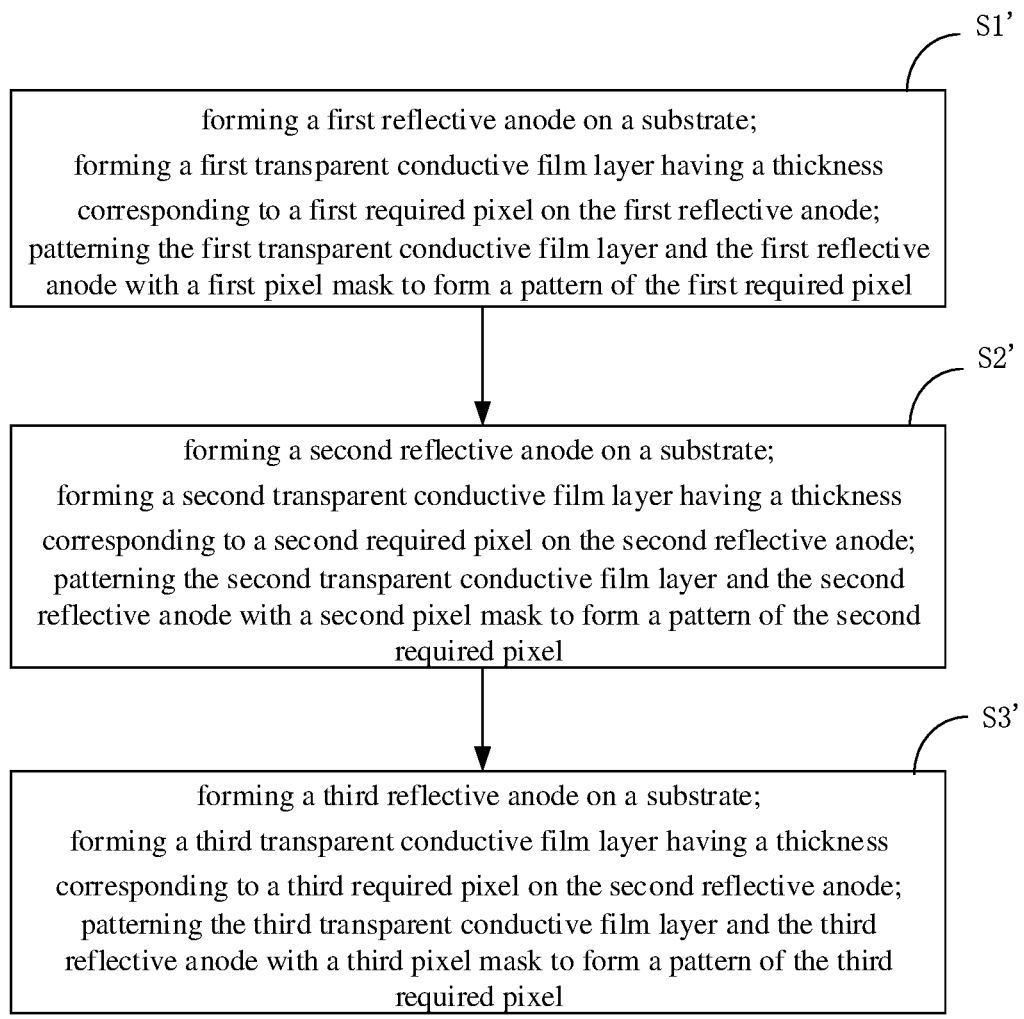
FIG. 3A is a flowchart illustrating a manufacturing process of OLED microcavity structure for a first required pixel, a second required pixel and a third required pixel according to an embodiment of the present disclosure.
Figure 4:
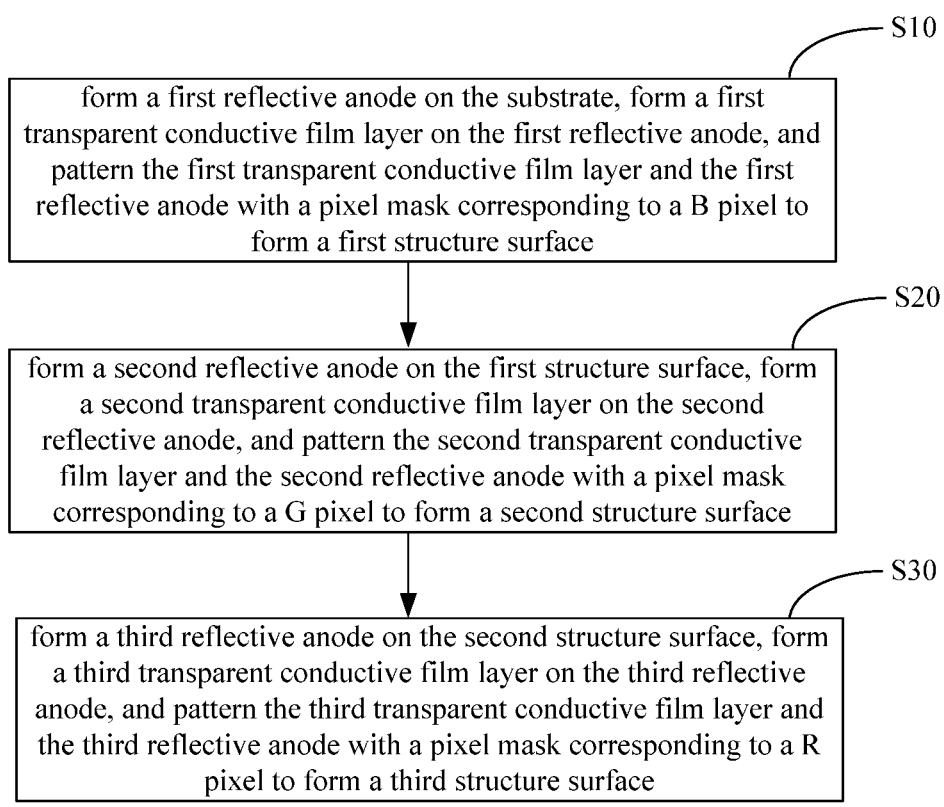
FIG. 4 is a flowchart illustrating a manufacturing process of OLED microcavity structure for R, G and B pixels according to an embodiment of the present disclosure.
Figure 4A:
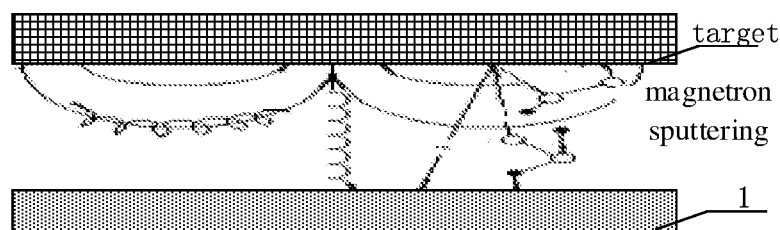
Figure 4B:
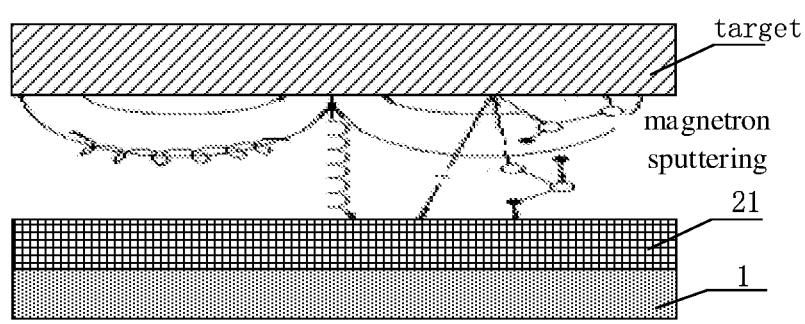
FIG. 4B is a schematic diagram illustrating a process of depositing a first transparent conductive film layer on the first reflective anode by magnetron sputtering.

As shown in FIG. 3A, an embodiment of the present disclosure provides a manufacturing method of an OLED microcavity structure, including:

Step S1': forming a first reflective anode on a substrate; forming a first transparent conductive film layer having a thickness corresponding to a first required pixel on the first reflective anode; patterning the first transparent conductive film layer and the first reflective anode with a first pixel mask corresponding to the required pixel to form a pattern of the first required pixel.

Step S2': forming a second reflective anode on a substrate; forming a second transparent conductive film layer having a thickness corresponding to a second required pixel on the second reflective anode; patterning the second transparent conductive film layer and the second reflective anode with a second pixel mask to form a pattern of the second required pixel.

Step S3': forming a third reflective anode on a substrate; forming a third transparent conductive film layer having a thickness corresponding to a third required pixel on the second reflective anode; patterning the third transparent conductive film layer and the third reflective anode with a third pixel mask to form a pattern of the third required pixel.

Figure 5:
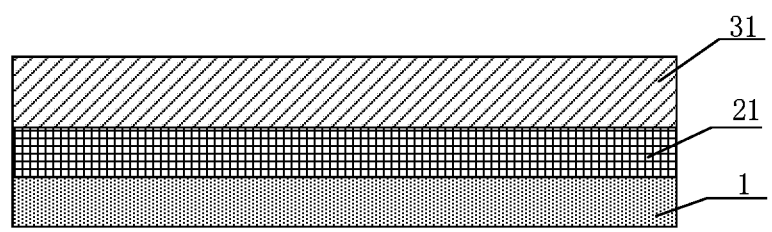
Figure 5A:
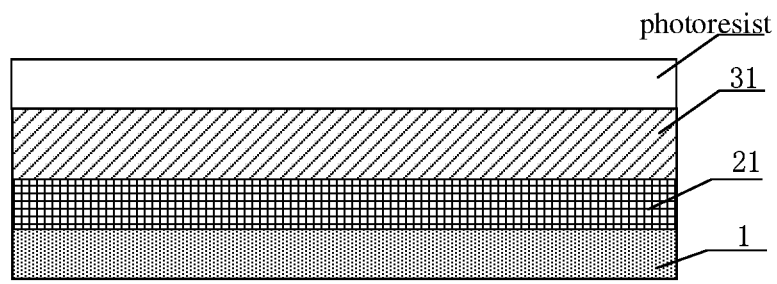
FIG. 5A is a schematic diagram illustrating a process of coating photoresist on the transparent conductive film layer.
Figure 5B:
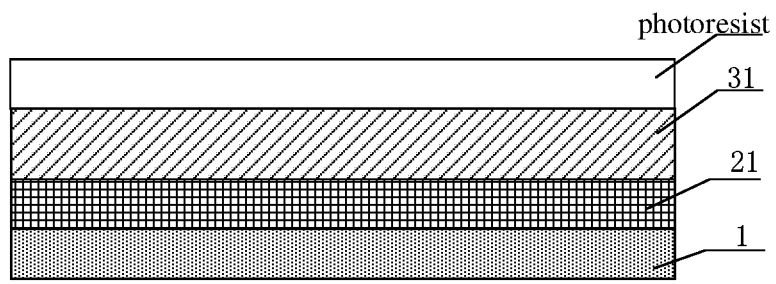
FIG. 5B is a schematic diagram illustrating performing an exposure process and a development process on the photoresist with the pixel mask corresponding to the blue pixel.
Figure 5C:
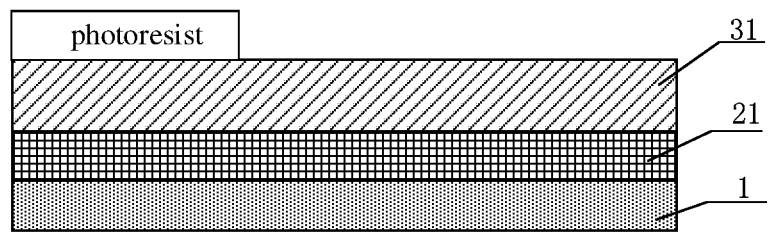
FIG. 5C is a schematic diagram illustrating a process of stripping off the photoresist with an acid solution.
Figure 5D:
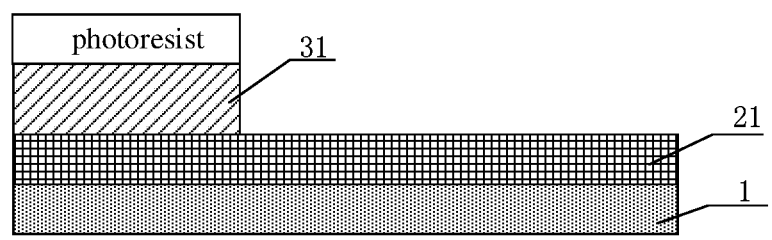
FIG. 5D is a schematic diagram illustrating a process of etching away part of the first transparent conductive film layer, which is not covered by the pixel mask corresponding to the blue pixel, with an acid solution.
Figure 5E:
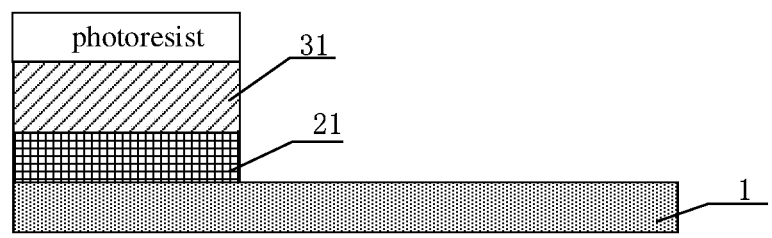
FIG. 5E is a schematic diagram illustrating a process of etching away part of the first reflective anode, which is not covered by the pixel mask corresponding to the blue pixel, with an acid solution.
Figure 6:
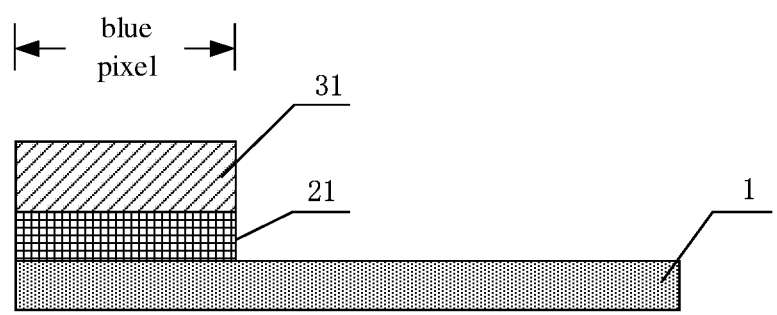
Figure 6A:
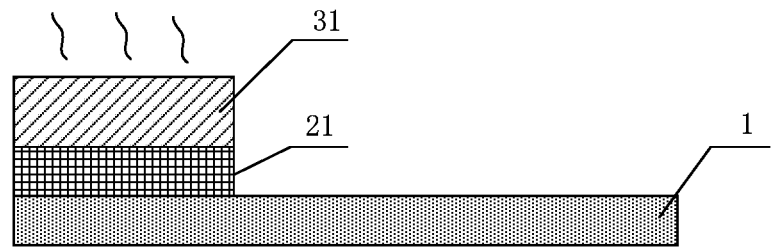
FIG. 6A is a schematic diagram illustrating a process of performing first annealing process on the first transparent conductive film layer after the first structure surface is formed.
Figure 6B:
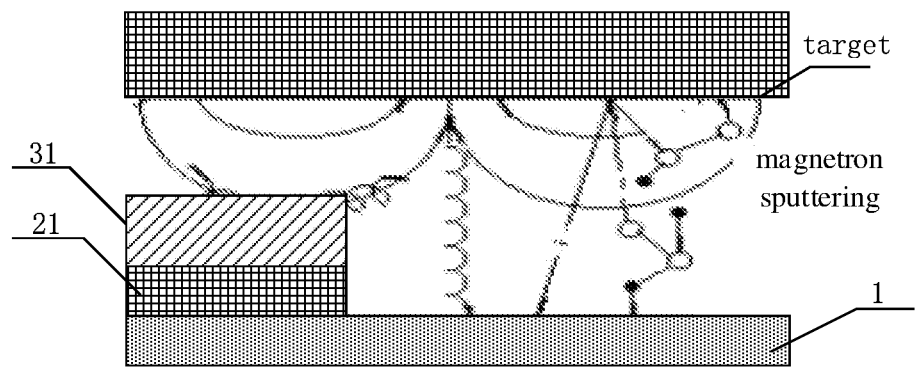
FIG. 6B is a schematic diagram illustrating a process of depositing a second reflective anode on the first structure surface by magnetron sputtering.
Figure 6C:
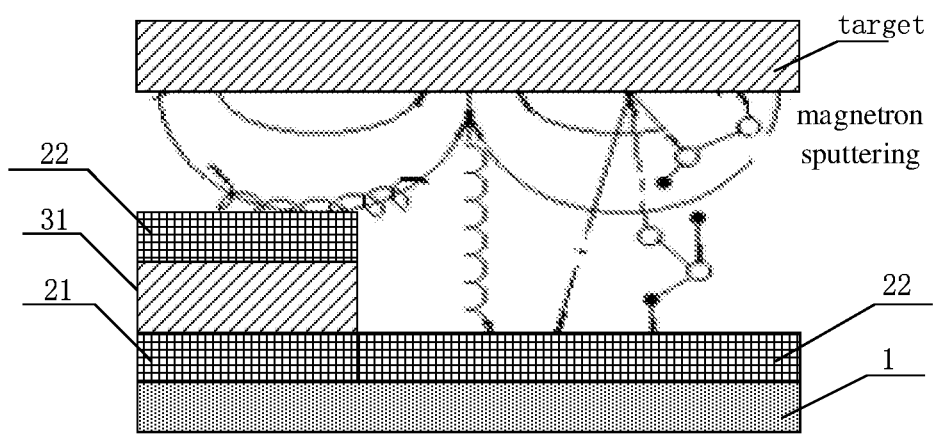
FIG. 6C is a schematic diagram illustrating a process of depositing a second transparent conductive film layer on the second reflective anode by magnetron sputtering.

With reference to FIGS. 4 to 10, an embodiment of the present disclosure provides a specific manufacturing method of OLED microcavity structures for R, G and B pixels, which specifically includes:

step S10: forming a first reflective anode 21 on a substrate, and forming a first transparent conductive film layer 31 on the first reflective anode 21, as shown in FIG. 5; and patterning the first transparent conductive film layer 31 and the first reflective anode 21 with a B-pixel mask to form a first structure surface, as shown in FIG. 6.

Figure 7:
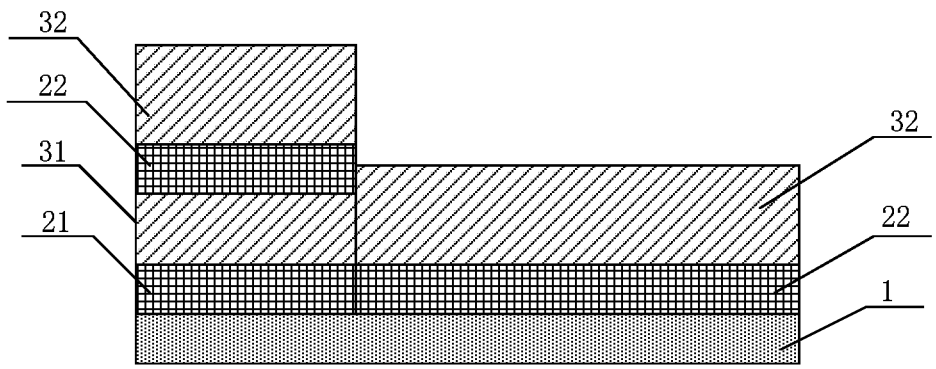
Figure 7A:
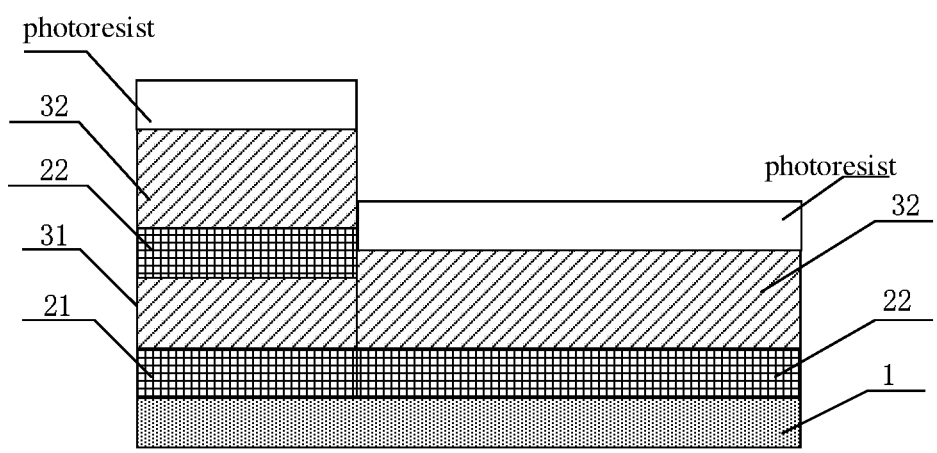
FIG. 7A is a schematic diagram illustrating a process of coating photoresist on the second transparent conductive film layer.
Figure 7B:
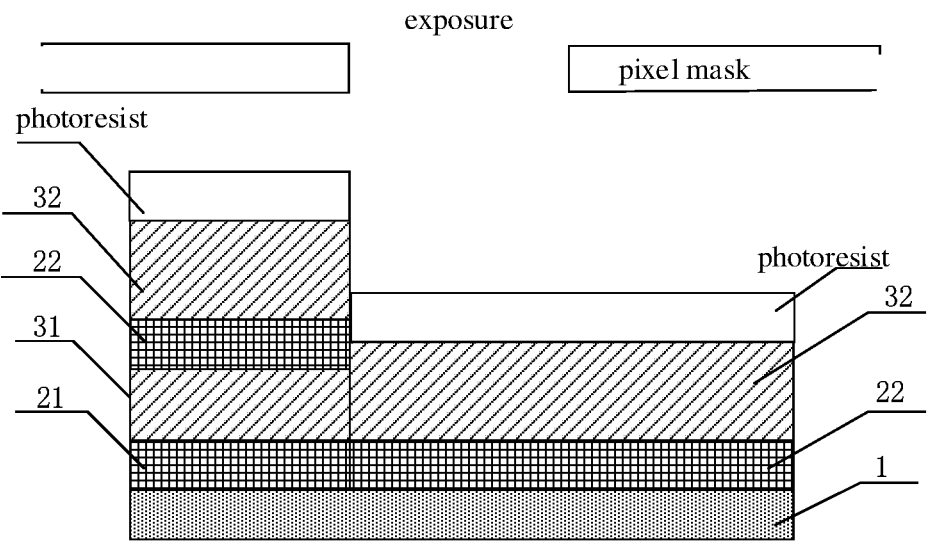
FIG. 7B is a schematic diagram illustrating performing an exposure process and a development process on the photoresist with the pixel mask corresponding to the green pixel.
Figure 7C:
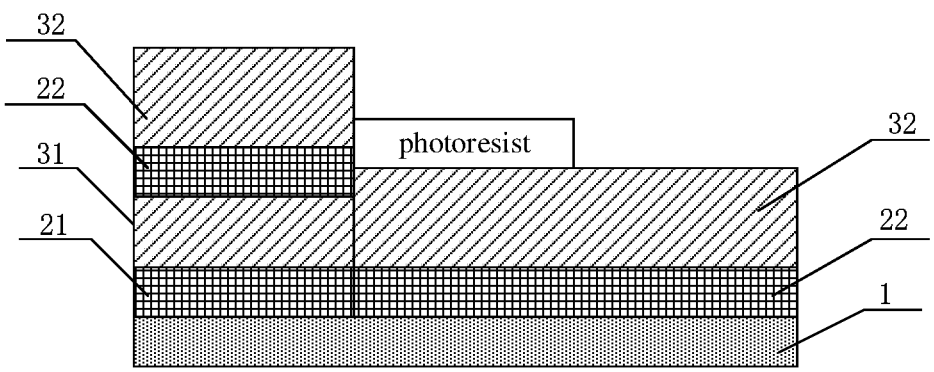
FIG. 7C is a schematic diagram illustrating a process of stripping off the photoresist with an acid solution.
Figure 7D:
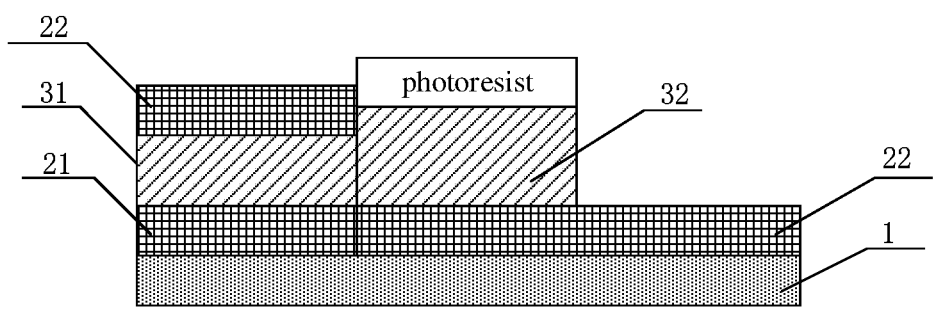
FIG. 7D is a schematic diagram illustrating a process of etching away part of the second transparent conductive film layer, which is not covered by the pixel mask corresponding to the green pixel, with an acid solution.
Figure 7E:
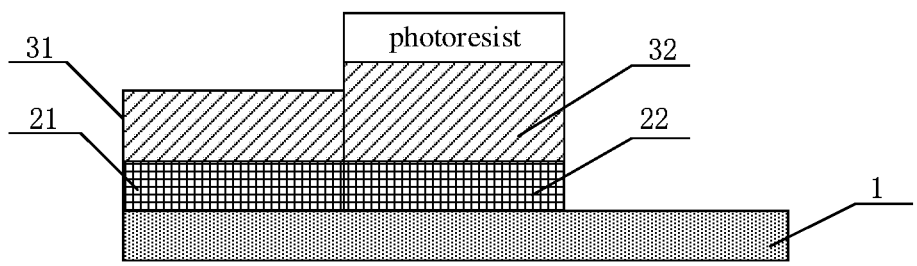
FIG. 7E is a schematic diagram illustrating a process of etching away part of the second reflective anode, which is not covered by the pixel mask corresponding to the green pixel, with an acid solution.
Figure 8:
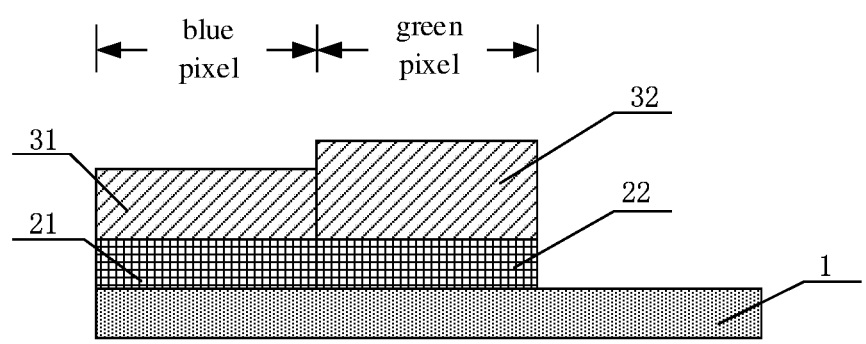
Figure 8A:
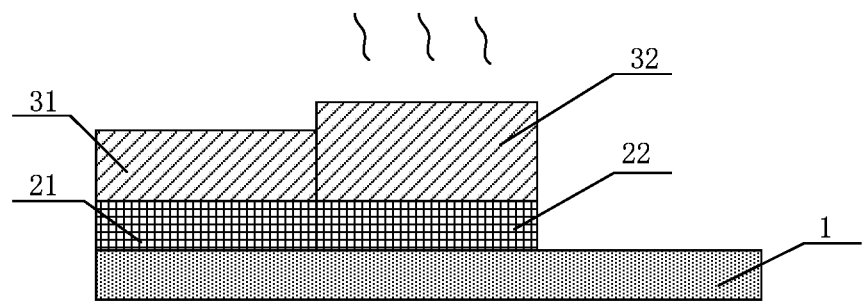
FIG. 8A is a schematic diagram illustrating a process of performing second annealing process on the second transparent conductive film layer after the first structure surface is formed.
Figure 8B:
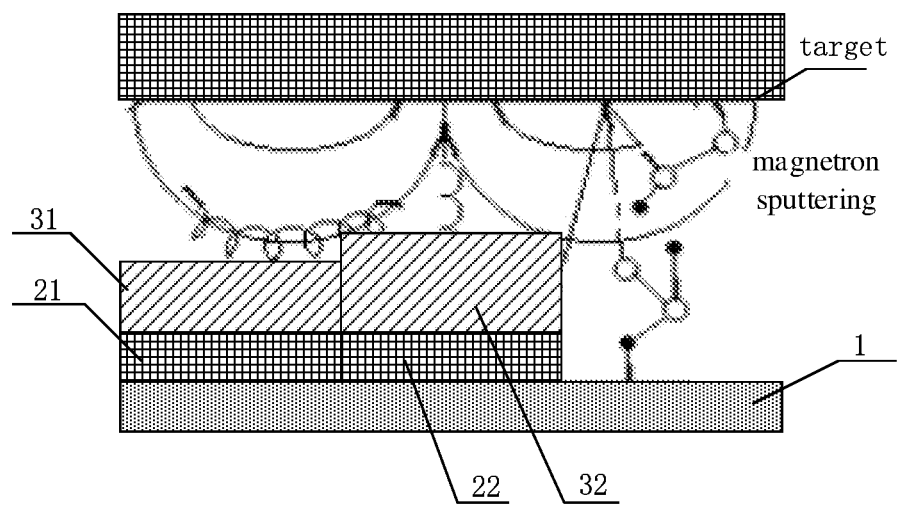
FIG. 8B is a schematic diagram illustrating a process of depositing a third reflective anode on the second structure surface by magnetron sputtering.
Figure 8C:
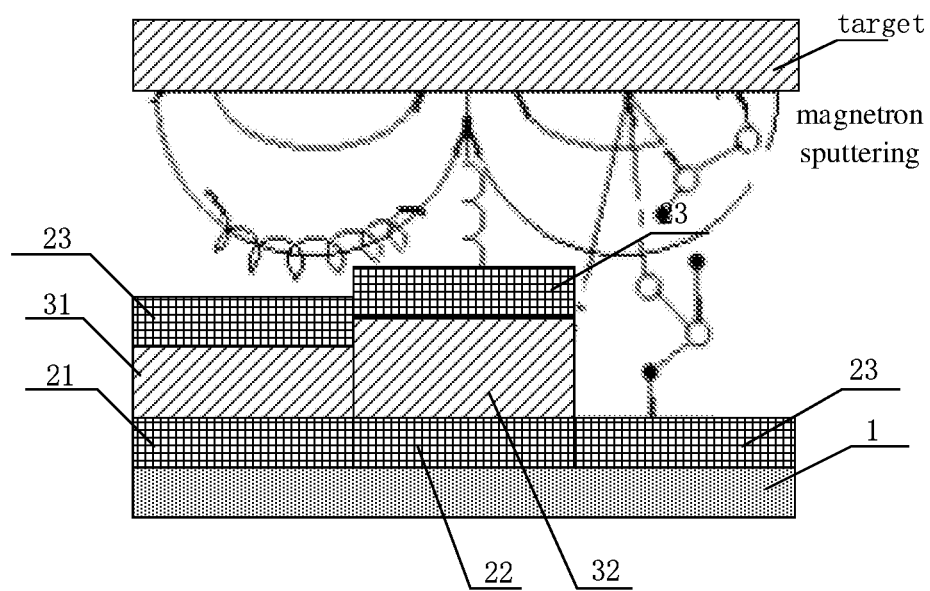
FIG. 8C is a schematic diagram illustrating a process of depositing a third transparent conductive film layer on the third reflective anode by magnetron sputtering.

Step S20: forming a second reflective anode 22 on the first structure surface, and forming a second transparent conductive film layer 32 on the second reflective anode 22, as shown in FIG. 7; and patterning the second transparent conductive film layer 32 and the second reflective anode 22 with a G-pixel mask to form a second structure surface, as shown in FIG. 8.

Figure 9:
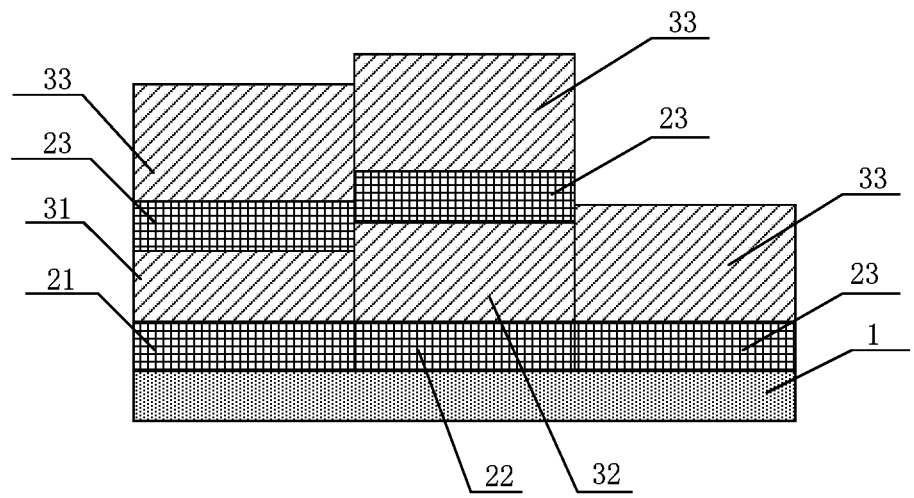
Figure 9A:
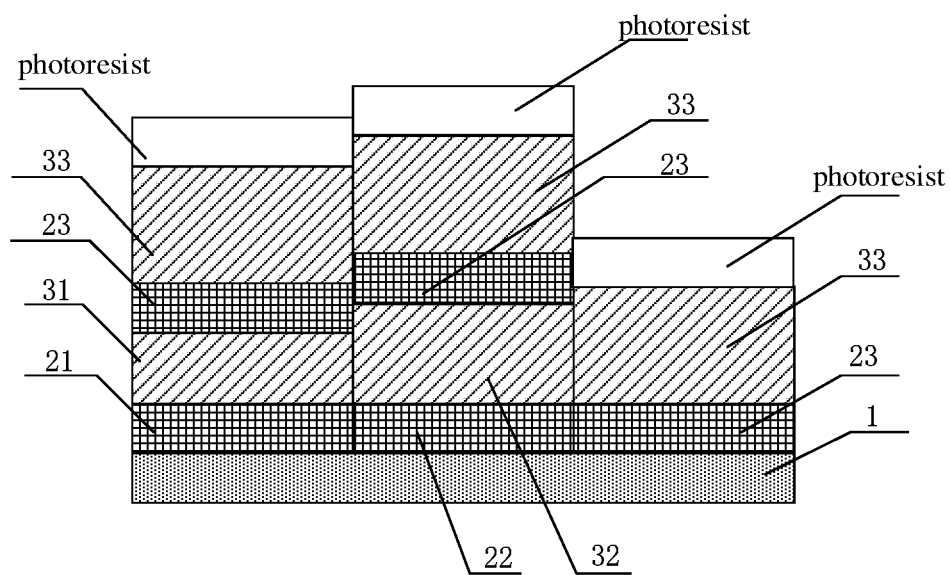
FIG. 9A is a schematic diagram illustrating a process of coating photoresist on the third transparent conductive film layer.
Figure 9B:
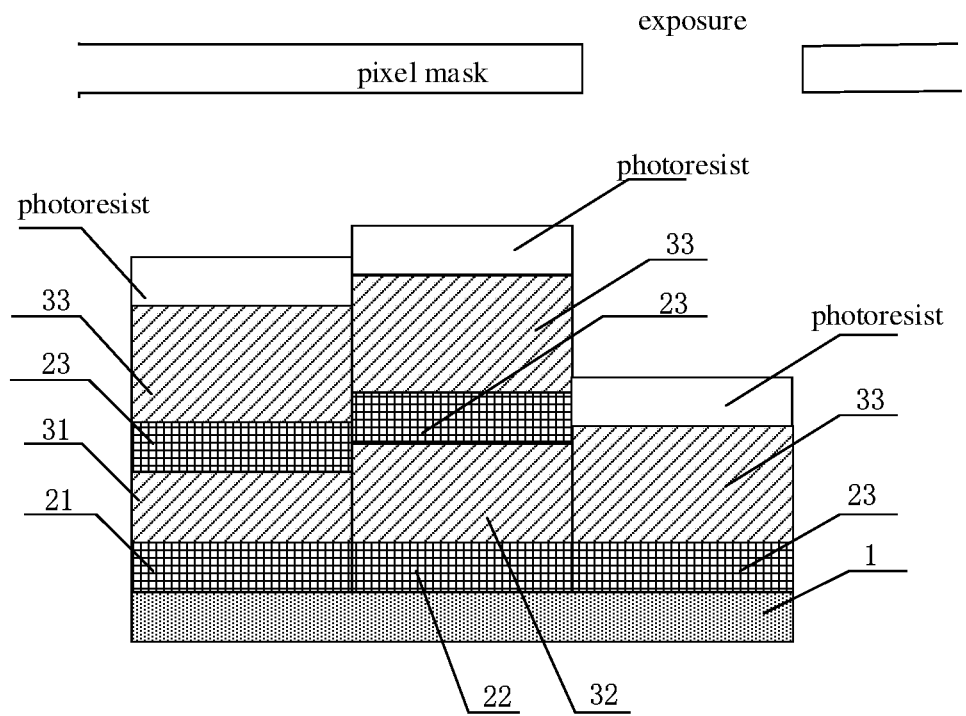
FIG. 9B is a schematic diagram illustrating performing an exposure process and a development process on the photoresist with the pixel mask corresponding to the red pixel.
Figure 9C:
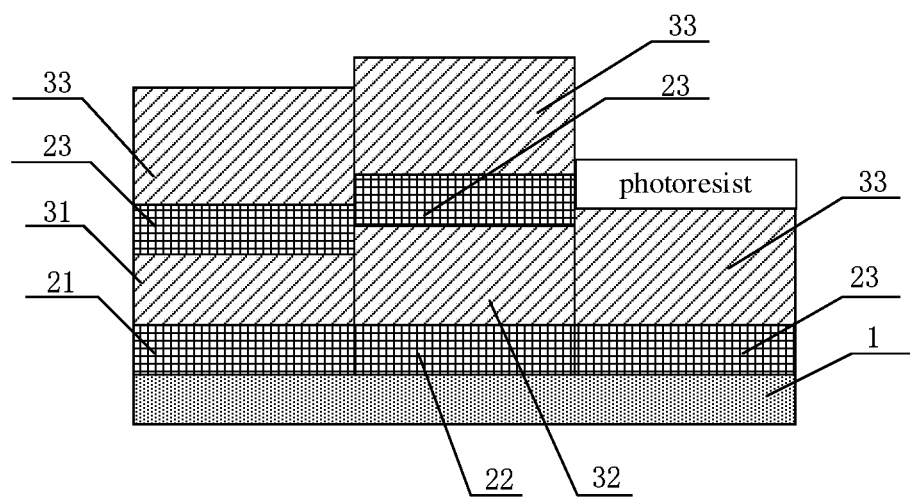
FIG. 9C is a schematic diagram illustrating a process of stripping off the photoresist with an acid solution.
Figure 9D:
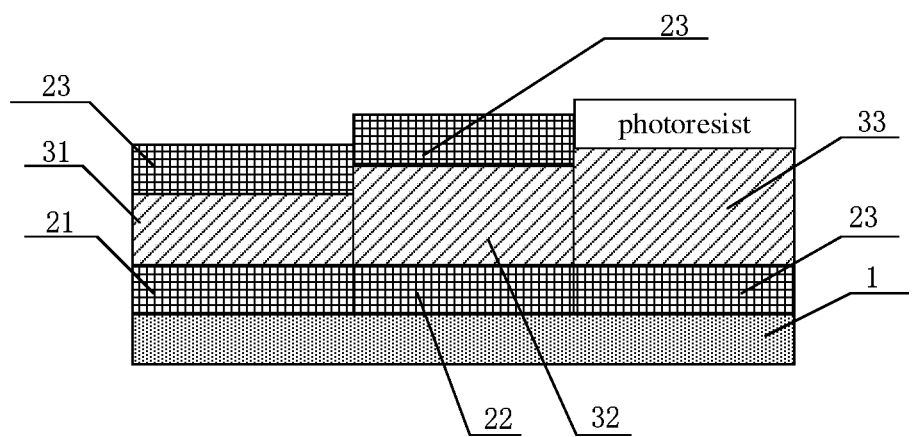
FIG. 9D is a schematic diagram illustrating a process of etching away part of the third transparent conductive film layer, which is not covered by the pixel mask corresponding to the red pixel, with an acid solution.
Figure 9E:
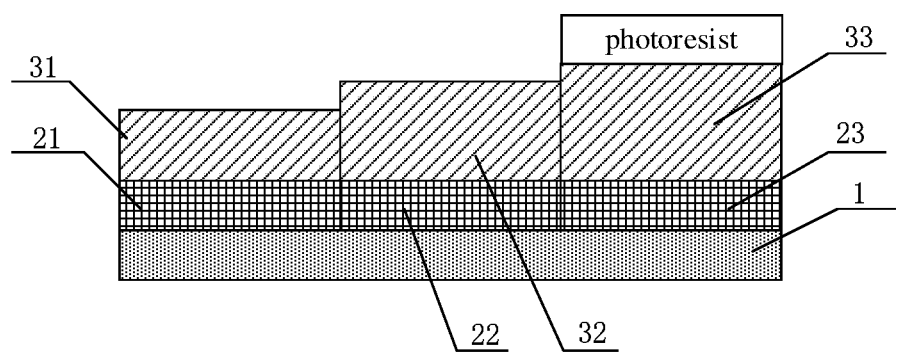
FIG. 9E is a schematic diagram illustrating a process of etching away part of the third reflective anode, which is not covered by the pixel mask corresponding to the red pixel, with an acid solution.
Figure 10:
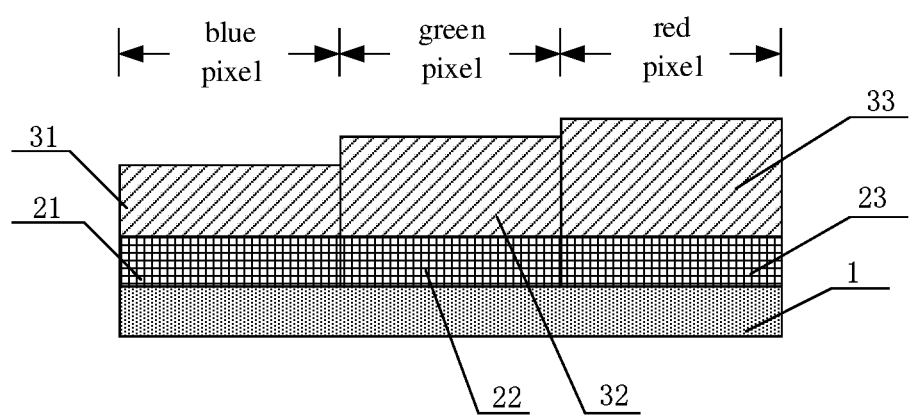

Step S30: forming a third reflective anode 23 on the second structure surface, and forming a third transparent conductive film layer 33 on the third reflective anode 23, as shown in FIG. 9; and patterning the third transparent conductive film layer 33 and the third reflective anode 23 with an R-pixel mask to form a third structure surface, as shown in FIG. 10.

By performing the steps S10, S20 and S30, B, G and R pixels are sequentially formed, and finally a required OLED microcavity structure is obtained.

A thickness of the first transparent conductive film layer 31 is 120 Å, a thickness of the second transparent conductive film layer 32 is 520 Å, and a thickness of the third transparent conductive film layer 33 is 820 Å.

It should be noted that the first transparent conductive film layer 31 is subjected to an annealing process after the first structure surface is formed; and the second transparent conductive film layer 32 is also subjected to an annealing process after the second structure surface is formed.

Specifically, the two annealing processes are both performed at 230° C. for 60 minutes.

To sum up, in the manufacturing method of OLED microcavity structure provided by the embodiments of the present disclosure, the reflective anode, patterning of which is very different from that of the transparent conductive film layer, is selected as a protection to prepare a relative thick transparent conductive film layer at one time, which does not lead to influence of the interface, eliminates an influence of the interface obtained by separately prepared transparent conductive film layers on the outgoing light of the microcavity structure, and also overcomes the technical problem that reflectivity is affected because the reflective anode is etched for a plurality of times during a patterning process of the transparent conductive film layer.

It is apparent that those skilled in the art may make various changes and variations to the embodiments of the present disclosure without departing from the spirit and scope of the present disclosure. If falling within the scope of the claims of the present disclosure and the scope of the technical equivalents of the claims, such changes and variations should be included in the present disclosure.

What is claimed is:

1. A manufacturing method of OLED microcavity structure, comprising:
    forming a first reflective anode on a substrate;
    forming a first transparent conductive film layer having a thickness corresponding to a first required pixel on the first reflective anode;
    patterning the first transparent conductive film layer and the first reflective anode with a first pixel mask to form a pattern of the first required pixel;
    forming a second reflective anode on a substrate;
    forming a second transparent conductive film layer having a thickness corresponding to a second required pixel on the second reflective anode;
    patterning the second transparent conductive film layer and the second reflective anode with a second pixel mask to form a pattern of the second required pixel;
    forming a third reflective anode on a substrate;
    forming a third transparent conductive film layer having a thickness corresponding to a third required pixel on the second reflective anode;
    patterning the third transparent conductive film layer and the third reflective anode with a third pixel mask to form a pattern of the third required pixel.

2. The manufacturing method of OLED microcavity structure of claim 1, wherein the pixel display structure comprises a blue pixel, a green pixel, and a red pixel,
    the patterning the first transparent conductive film layer and the first reflective anode with a fit pixel mask to form a pattern of the first required pixel comprises: pattering the first transparent conductive film layer and the first reflective anode with a pixel mask corresponding to the blue pixel to form a first structure surface;
    the patterning the second transparent conductive film layer and the second reflective anode with a second pixel mask to form a pattern of the second required pixel comprises: patterning the second transparent conductive film layer and the second reflective anode with a pixel mask corresponding to the green pixel to form a second structure surface; and
    the patterning the third transparent conductive film layer and the third reflective anode with a third pixel mask to form a pattern of the third required pixel comprises: patterning the third transparent conductive film layer and the third reflective anode with a pixel mask corresponding to the red pixel to forma third structure surface.

3. The manufacturing method of OLED microcavity structure of claim 2, further comprising:
    performing a first annealing process on the first transparent conductive film layer after the first structure surface is formed; and
    performing a second annealing process on the second transparent conductive film layer after the second structure surface is formed.

4. The manufacturing method of OLED microcavity structure of claim 3, wherein the first and second annealing processes am both performed at 230° C. for 60 minutes.

5. The manufacturing method of OLED microcavity structure of claim 3, wherein the first reflective anode and the first transparent conductive film layer are deposited by magnetron sputtering,
    the second reflective anode and the second transparent conductive film layer are deposited by magnetron sputtering, and the third reflective anode and the third transparent conductive film layer are deposited by magneton sputtering.

6. The manufacturing method of OLED microcavity structure of claim 3, wherein a material of the first reflective anode is molybdenum aluminum rubidium alloy,
a material of the second reflective anode is molybdenum aluminum rubidium alloy, and
a material of the third reflective anode is molybdenum aluminum rubidium alloy.

7. The manufacturing method of OLED microcavity structure of claim 4, wherein the first reflective anode and the first transparent conductive film layer are deposited by magnetron sputtering,
the second reflective anode and the second transparent conductive film layer are deposited by magnetron sputtering, and
the third reflective anode and the third transparent conductive film layer are deposited by magnetron sputtering.

8. The manufacturing method of OLED microcavity structure of claim 4, wherein a material of the first reflective anode is molybdenum aluminum rubidium alloy,
a material of the second reflective anode is molybdenum aluminum rubidium alloy, and
a material of the third reflective anode is molybdenum aluminum rubidium alloy.

9. The manufacturing method of OLED microcavity structure of claim 2, wherein a thickness of the first transparent conductive film layer is 120 Å;
a thickness of the second transparent conductive film layer is 520 Å; and
a thickness of the third transparent conductive film layer is 820 Å.

10. The manufacturing method of OLED microcavity structure of claim 9, wherein the first reflective anode and the first transparent conductive film layer are deposited by magnetron sputtering,
the second reflective anode and the second transparent conductive film layer are deposited by magneton sputtering, and
the third reflective anode and the third transparent conductive film layer are deposited by magnetron sputtering.

11. The manufacturing method of OLED microcavity structure of claim 2, wherein the first reflective anode and the first transparent conductive film layer are deposited by magnetron sputtering,
the second reflective anode and the second transparent conductive film layer are deposited by magnetron sputtering, and
the third reflective anode and the third transparent conductive film layer are deposited by magnetron sputtering.

12. The manufacturing method of OLED microcavity structure of claim 2, wherein a material of the first reflective anode is molybdenum aluminum rubidium alloy,
a material of the second reflective anode is molybdenum aluminum rubidium alloy, and
a material of the third reflective anode is molybdenum aluminum rubidium alloy.

13. The manufacturing method of OLED microcavity structure of claim 1, wherein the patterning the first transparent conductive film layer and the first reflective anode with a first pixel mask to form the pattern of the first required pixel comprises:
coating photoresist on the first transparent conductive film layer;
performing an exposure process and a development process on the photoresist with the first pixel mask; and
stripping off the photoresist with an acid solution and etching away part of the first transparent conductive film layer and part of the first reflective anode, which are not covered by the first pixel mask,
the patterning the second transparent conductive film layer and the second reflective anode with a second pixel mask to form a pattern of the second required pixel comprises:
coating photoresist on the second transparent conductive film layer;
performing an exposure process and a development process on the photoresist with the second pixel mask; and
stripping off the photoresist with an acid solution and etching away part of the second transparent conductive film layer and part of the second reflective anode, which are not covered by the pixel mask, and
the patterning the third transparent conductive film layer and the third reflective anode with a third pixel mask to form a pattern of the third required pixel comprises:
coating photoresist on the third transparent conductive film layer;
performing an exposure process and a development process on the photoresist with the third pixel mask; and
stripping off the photoresist with an acid solution and etching away part of the third transparent conductive film layer and part of the third reflective anode, which are not covered by the third pixel mask.

14. The manufacturing method of OLED microcavity structure of claim 13, wherein the stripping off the photoresist with the acid solution and etching away part of the first transparent conductive film layer and part of the first reflective anode, which are not covered by the first pixel mask, comprises:
etching away part of the first transparent conductive film layer, which is not covered by the first pixel mask, with an acid solution; and
etching away part of the first reflective anode, which is not covered by the first pixel mask, with an acid solution,
the stripping off the photoresist with an acid solution and etching away part of the second transparent conductive film layer and part of the second reflective anode, which are not covered by the pixel mask, comprises:
etching away part of the second transparent conductive film layer, which is not covered by the second pixel mask, with an acid solution; and
etching away part of the second reflective anode, which is not covered by the second pixel mask, with an acid solution, and
the stripping off the photoresist with an acid solution and etching away part of the third transparent conductive film layer and part of the third reflective anode, which are not covered by the third pixel mask, comprises:
etching away part of the third transparent conductive film layer, which is not covered by the third pixel mask, with an acid solution; and
etching away part of the third reflective anode, which is not covered by the third pixel masks with an acid solution.

15. The manufacturing method of OLED microcavity structure of claim 14, wherein the first reflective anode and the first transparent conductive film layer are deposited by magnetron sputtering, the second reflective anode and the second transparent conductive film layer are deposited by magnetron sputtering, and the third reflective anode and the third transparent conductive film layer are deposited by magnetron sputtering.

16. The manufacturing method of OLED microcavity structure of claim 13, wherein the first reflective anode and the first transparent conductive film layer are deposited by magnetron sputtering, the second reflective anode and the second transparent conductive film layer are deposited by magnetron sputtering, and the third reflective anode and the third transparent conductive film layer are deposited by magnetron sputtering.

17. The manufacturing method of OLED microcavity structure of claim 1, wherein the first reflective anode and the first transparent conductive film layer are deposited by magnetron sputtering, the second reflective anode and the second transparent conductive film layer are deposited by magnetron sputtering, and the third reflective anode and the third transparent conductive film layer are deposited by magnetron sputtering.

18. The manufacturing method of OLED microcavity structure of claim 1, wherein a material of the first reflective anode is molybdenum aluminum rubidium alloy, a material of the second reflective anode is molybdenum aluminum rubidium alloy, and a material of the third reflective anode is molybdenum aluminum rubidium alloy.

19. The manufacturing method of OLED microcavity structure of claim 1, wherein a thickness of the first transparent conductive film layer, a thickness of the second transparent conductive film layer, and a thickness of the third transparent conductive film layer are different from one another.

20. The manufacturing method of OLED microcavity structure of claim 1, wherein the first reflective anode, the second reflective anode, and the third reflective anode have a same thickness.

* * * * *